(12) United States Patent
Kim et al.

(10) Patent No.: US 11,282,738 B2
(45) Date of Patent: Mar. 22, 2022

(54) LIFT PIN MODULE

(71) Applicant: SAMSUNG ELECTRONICS CO., LTD., Suwon-si (KR)

(72) Inventors: Seung-Nam Kim, Hwaseong-si (KR);
Sung-Keun Cho, Suwon-si (KR);
Seong Eon Park, Osan-si (KR);
Jung-Sub Shin, Seoul (KR);
Joon-Sung Lee, Hwaseong-si (KR);
Hyun Ik Joe, Hwaseong-si (KR);
Hyeon Cheol Jin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 109 days.

(21) Appl. No.: 16/912,875

(22) Filed: Jun. 26, 2020

(65) Prior Publication Data
US 2021/0183686 A1    Jun. 17, 2021

(30) Foreign Application Priority Data
Dec. 16, 2019 (KR) .......................... 10-2019-0167411

(51) Int. Cl.
*H01L 21/687* (2006.01)
(52) U.S. Cl.
CPC .............................. *H01L 21/68742* (2013.01)
(58) Field of Classification Search
CPC ........... H01L 21/68742; H01L 21/6875; H01L 21/68785; C23C 14/50; C23C 16/4583
See application file for complete search history.

(56) References Cited

U.S. PATENT DOCUMENTS

| | | |
|---|---|---|
| 5,933,943 A | 8/1999 | Chou |
| 6,572,708 B2 | 6/2003 | Gujer et al. |
| 10,192,770 B2 | 1/2019 | Yudovsky |
| 10,195,704 B2 | 2/2019 | Himmelsbach et al. |
| 10,249,522 B2 | 4/2019 | Wu et al. |
| 2009/0314211 A1 | 12/2009 | Du Bois et al. |
| 2010/0101491 A1 | 4/2010 | Aida |
| 2011/0222038 A1 | 9/2011 | Yamashita |
| 2011/0315080 A1 | 12/2011 | Choi et al. |
| 2014/0097175 A1 | 4/2014 | Yu et al. |
| 2015/0348823 A1 | 12/2015 | Chia et al. |
| 2017/0125280 A1 | 5/2017 | Ghosh et al. |
| 2018/0053683 A1 | 2/2018 | Yoon et al. |

(Continued)

FOREIGN PATENT DOCUMENTS

| | | |
|---|---|---|
| JP | 11204430 A | 7/1999 |
| JP | 2001030250 A | 2/2001 |

(Continued)

*Primary Examiner* — Peter B Kim
(74) *Attorney, Agent, or Firm* — Sughrue Mion, PLLC

(57) ABSTRACT

A lift pin module includes a lift pin which includes a head portion disposed at a first end of the lift pin, and a connecting portion disposed at a second end of the lift pin opposite to the first end, the head portion connected to a stage disposed inside a semiconductor process chamber, and the head portion extending in a first direction; an upper weight which includes a side surface with an opening extending in the first direction, the opening configured to receive the lift pin therein, and the upper weight surrounding the connecting portion of the lift pin; and a lower weight screwed to the upper weight, the lower weight disposed below the upper weight.

20 Claims, 22 Drawing Sheets

(56) References Cited

U.S. PATENT DOCUMENTS

| | | |
|---|---|---|
| 2018/0090363 A1 | 3/2018 | Breninger et al. |
| 2019/0027394 A1 | 1/2019 | Sarode Vishwanath et al. |
| 2019/0035671 A1 | 1/2019 | Ha et al. |
| 2019/0080955 A1 | 3/2019 | Lee et al. |
| 2019/0109036 A1 | 4/2019 | Yudovsky |
| 2019/0131165 A1 | 5/2019 | Nguyen |
| 2019/0139810 A1 | 5/2019 | Chen et al. |
| 2019/0157130 A1 | 5/2019 | Lee et al. |
| 2021/0005504 A1* | 1/2021 | Han ............... H01L 21/68785 |

FOREIGN PATENT DOCUMENTS

| | | |
|---|---|---|
| JP | 2005197380 A | 7/2005 |
| JP | 2006303138 A | 11/2006 |
| JP | 2008029943 A1 | 1/2010 |
| KR | 20020088483 A1 | 11/2002 |
| KR | 1020040009247 A | 1/2004 |
| KR | 100525571 B1 | 11/2005 |
| KR | 100553102 B1 | 2/2006 |
| KR | 100566324 B1 | 3/2006 |
| KR | 100596328 B1 | 7/2006 |
| KR | 1020060078545 A | 7/2006 |
| KR | 1020070080768 A | 8/2007 |
| KR | 100920384 B1 | 10/2009 |
| KR | 100989852 B1 | 10/2010 |
| KR | 100994074 B1 | 11/2010 |
| KR | 101123576 B1 | 3/2012 |
| KR | 101144587 B1 | 5/2012 |
| KR | 1020120129861 A | 11/2012 |
| KR | 101218570 B1 | 1/2013 |
| KR | 101235623 B1 | 2/2013 |
| KR | 1020130015614 A | 2/2013 |
| KR | 101240391 B1 | 3/2013 |
| KR | 101305139 B1 | 9/2013 |
| KR | 101362458 B1 | 2/2014 |
| KR | 1020140139935 A | 12/2014 |
| KR | 101519814 B1 | 5/2015 |
| KR | 1020150066285 A | 6/2015 |
| KR | 101539674 B1 | 8/2015 |
| KR | 101738986 B1 | 5/2017 |
| KR | 101748252 B1 | 6/2017 |
| KR | 1020180014414 A | 2/2018 |
| KR | 101996051 B1 | 7/2019 |

* cited by examiner

LIFT PIN MODULE

CROSS-REFERENCE TO THE RELATED APPLICATION

This application is based on and claims priority under 35 U.S.C. § 119 to Korean Patent Application No. 10-2019-0167411, filed on Dec. 16, 2019, in the Korean Intellectual Property Office, the disclosure of which is incorporated herein in its entirety by reference.

BACKGROUND

1. Field

Embodiments of the present disclosure relate to a lift pin module.

2. Description of Related Art

The role of semiconductor devices has become more and more important in the information society with the recent rapid spread of information media, and semiconductor devices are widely used in various industrial fields. A method for fabricating a semiconductor device includes a process of forming a predetermined film on a substrate, and a process of forming the film into a pattern having electrical characteristics.

The pattern is formed by sequentially or repeatedly performing unit processes such as chemical vapor deposition, sputtering, photolithography, etching, ion implantation, and chemical mechanical polishing (CMP) inside a process chamber. In such unit processes, a plate for supporting and fixing the substrate is used. A lift pin module for loading and unloading substrates in the process chamber is used.

SUMMARY

Aspects of embodiments of the present disclosure provide a lift pin module in which a sidewall of a head portion of a lift pin being in contact with a stage is formed into a curved surface to alleviate a stress to be applied to the head portion of the lift pin.

Aspects of embodiments of the present disclosure also provide a lift pin module that prevents an occurrence of a height difference between a plurality of lift pin modules due to foreign matters that may exist between an upper weight and a lower weight, by screwing the upper weight and the lower weight.

Aspects of embodiments of the present disclosure also provide a lift pin module in which fastening difficulty of the lift pin module is reduced by connecting the upper weight to the lift pin in a state in which an opening is formed on the side surface of the upper weight and the lift pin is installed on the stage.

Aspects of embodiments of the present disclosure also provide a lift pin module capable of achieving structural stability even when the lift pin module inclines, by forming an inclined surface on the lower surface of the lower weight.

According to an aspect of the present disclosure, a lift pin module is provided. The lift pin module includes: a lift pin which includes a head portion disposed at a first end of the lift pin, and a connecting portion disposed at a second end of the lift pin opposite to the first end, the head portion connected to a stage disposed inside a semiconductor process chamber, and the head portion extending in a first direction; an upper weight which includes a side surface with an opening extending in the first direction, the opening configured to receive the lift pin therein, and the upper weight surrounding the connecting portion of the lift pin; and a lower weight screwed to the upper weight, the lower weight disposed below the upper weight.

According to an aspect of the present disclosure, a lift pin module is provided. The lift pin module includes: a lift pin including a head portion disposed at a first end of the lift pin, and a connecting portion disposed at a second end of the lift pin opposite to the first end, the head portion connected to a stage disposed inside a semiconductor process chamber, and the head portion extending in a first direction; an upper weight into which the lift pin is inserted and which surrounds the connecting portion of the lift pin; and a lower weight into which a part of the upper weight is inserted and which is screwed to the upper weight, the lower weight disposed below the upper weight. A lower surface of the lower weight includes: a first surface which overlaps the lift pin in the first direction, and a second surface which surrounds an edge of the first surface and is inclined with respect to the first surface.

According to an aspect of the present disclosure, a lift pin module is provided. The lift pin module includes: a lift pin which includes a head portion disposed at a first end of the lift pin, and a connecting portion disposed at a second end of the lift pin opposite to the first end, the head portion connected to a stage disposed inside a semiconductor process chamber, the head portion extending in a first direction; an upper weight which includes a side surface with an opening extending in the first direction, the opening configured to receive the lift pin therein, and the upper weight surrounding the connecting portion of the lift pin; and a lower weight into which a part of the upper weight is inserted, the lower weight screwed to the upper weight and disposed below the upper weight. The connecting portion of the lift pin includes: a first portion having a first width in a second direction perpendicular to the first direction, and a second portion disposed between the first portion and the lower weight in the first direction and having a second width in the second direction greater than the first width. A lower surface of the lower weight includes: a first surface which overlaps the lift pin in the first direction, and a second surface which surrounds an edge of the first surface and is inclined with respect to the first surface.

However, aspects of embodiments of the present disclosure are not restricted to the ones set forth herein. The above and other aspects of embodiments of the present disclosure will become more apparent to one of ordinary skill in the art to which embodiments of the present disclosure pertain by referencing the detailed description of the present disclosure given below.

BRIEF DESCRIPTION OF THE DRAWINGS

The above and other aspects and features of embodiments of the present disclosure will become more apparent by describing in detail non-limiting example embodiments thereof with reference to the attached drawings, in which.

DETAILED DESCRIPTION

Hereinafter, a lift pin module according to some embodiments of the present disclosure will be described with reference to FIGS. 1 to 9.

Figure 1:
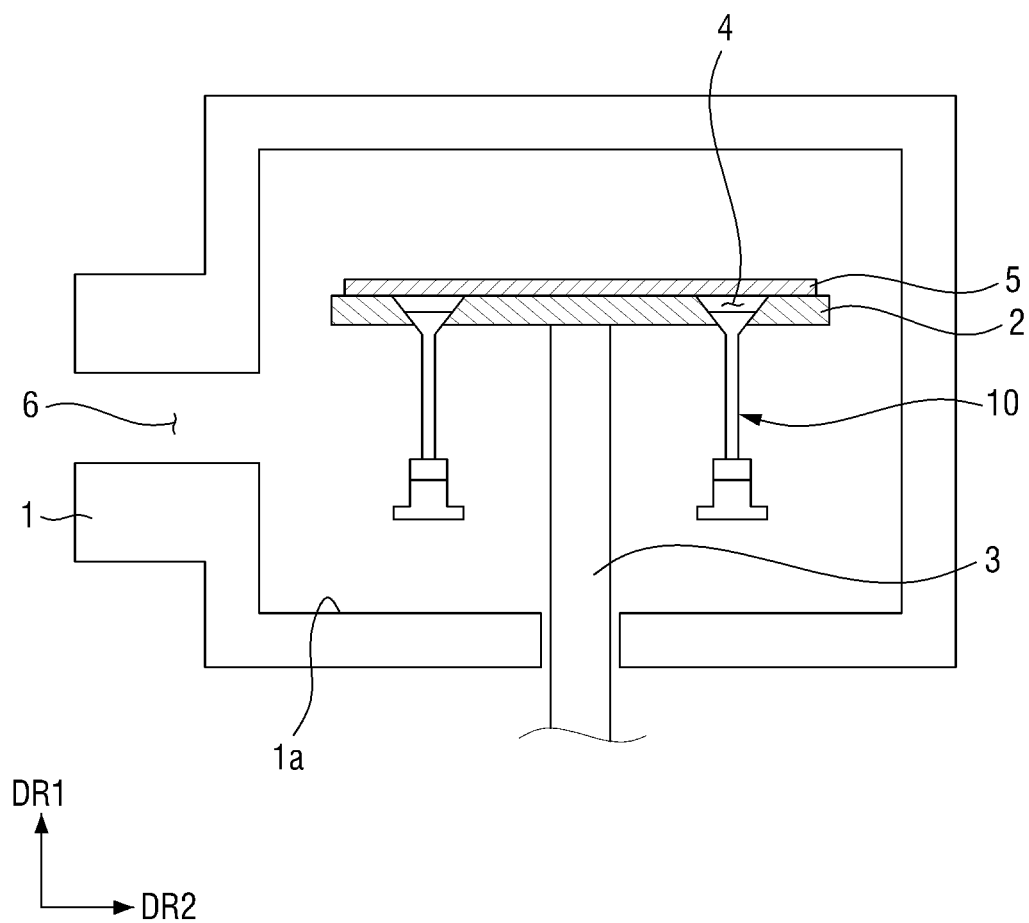
FIG. 1 is a diagram for schematically illustrating a semiconductor process chamber in which a lift pin module according to some embodiments of the present disclosure is installed.
Figure 2:
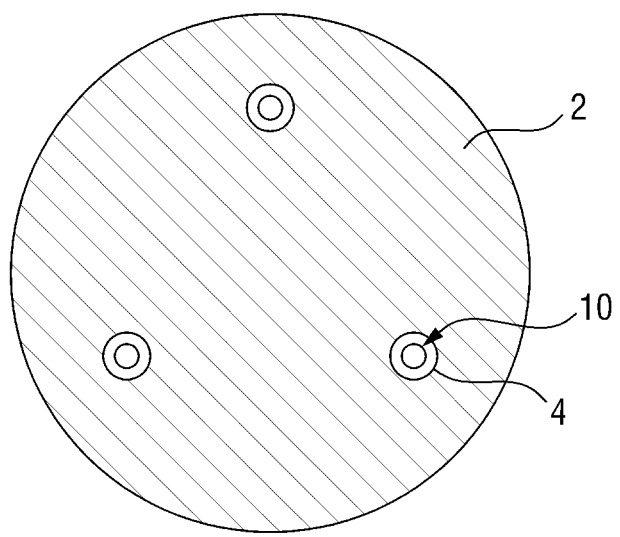
FIG. 2 is a diagram for illustrating an upper surface of a stage on which the lift pin module according to some embodiments of the present disclosure is installed.
Figure 3:
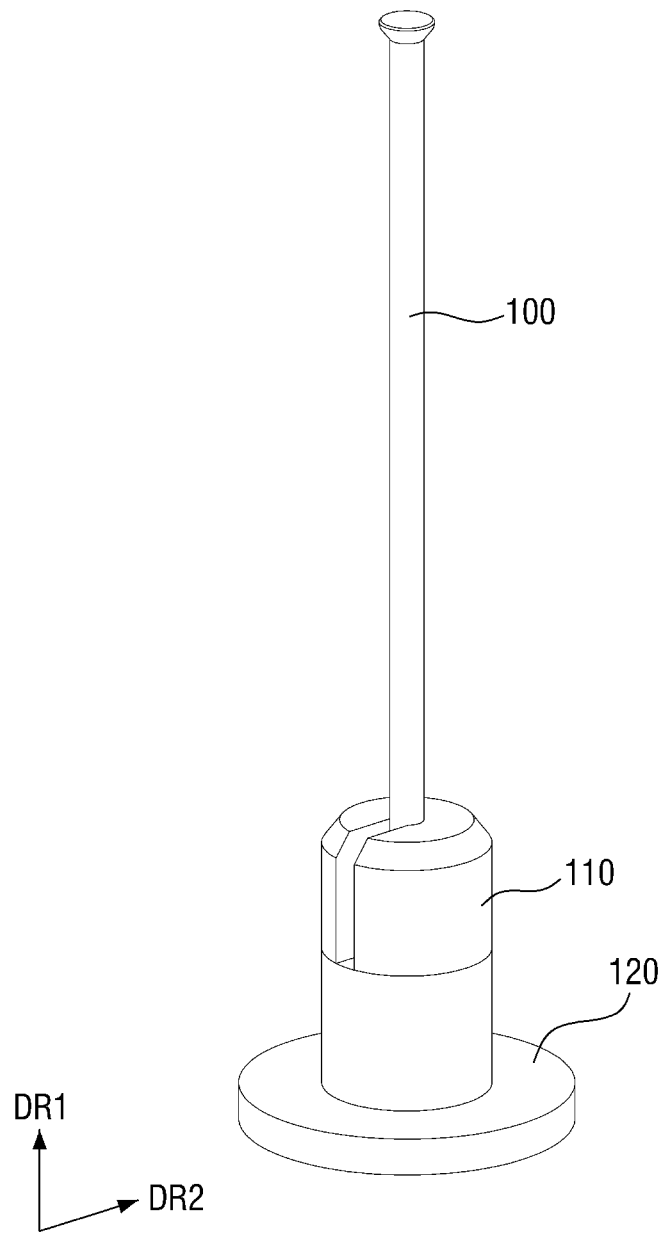
FIG. 3 is a perspective view for illustrating the lift pin module according to some embodiments of the present disclosure.
Figure 4:
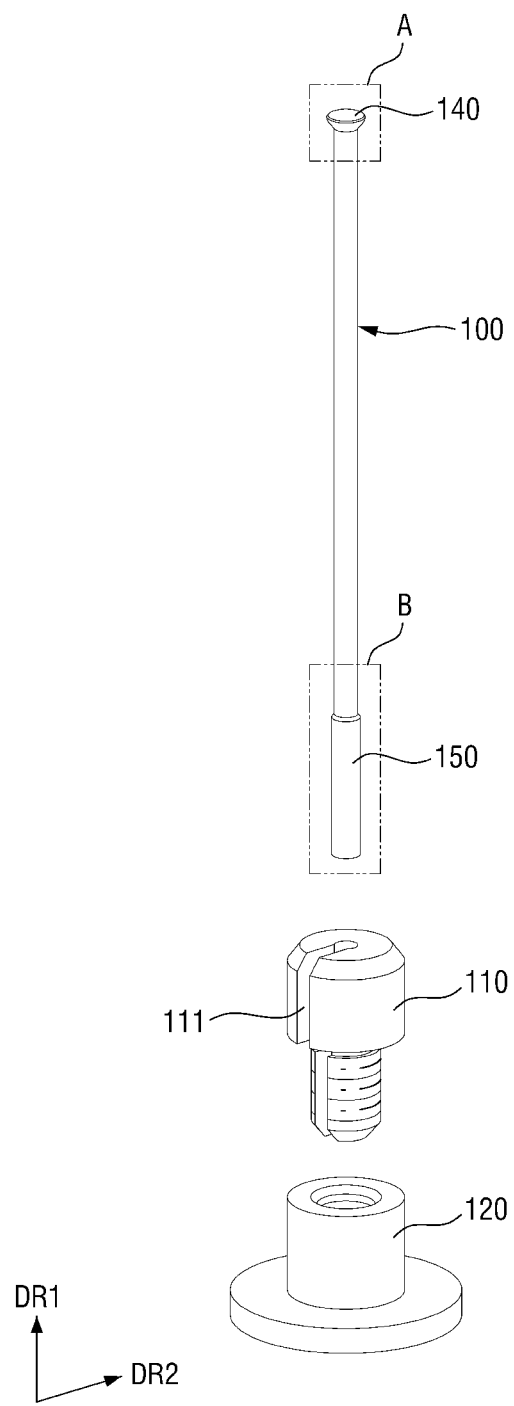
FIG. 4 is an exploded perspective view for illustrating the lift pin module according to some embodiments of the present disclosure.
Figure 5:
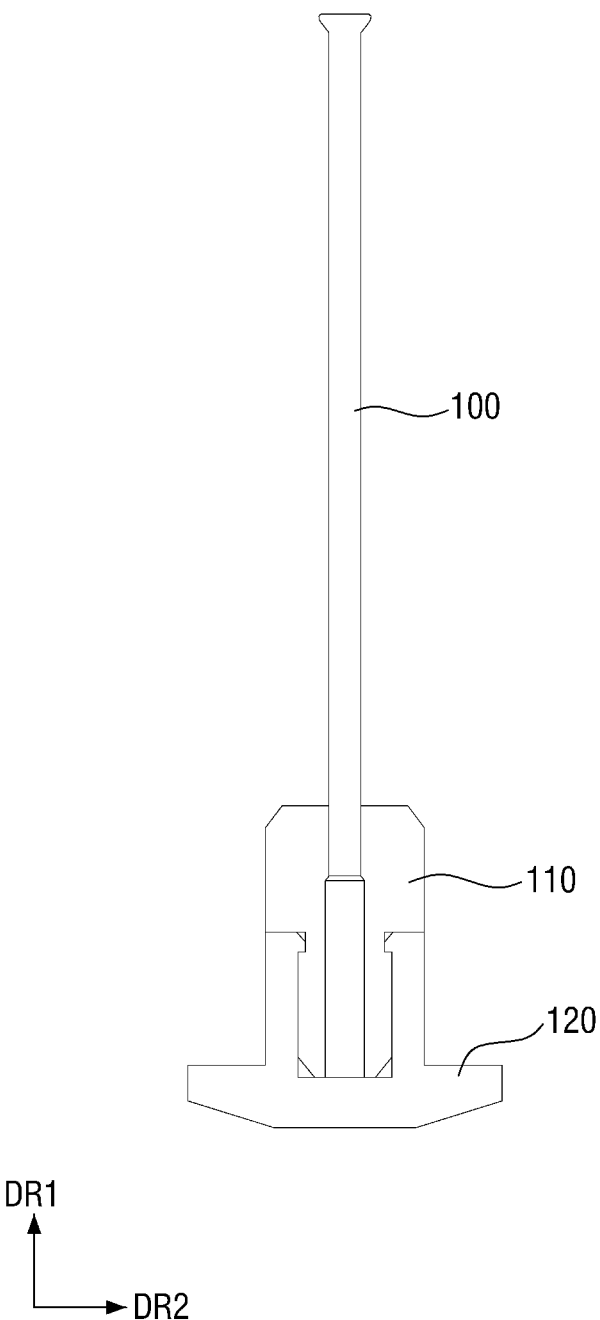
FIG. 5 is a cross-sectional view for illustrating the lift pin module according to some embodiments of the present disclosure.
Figure 6:
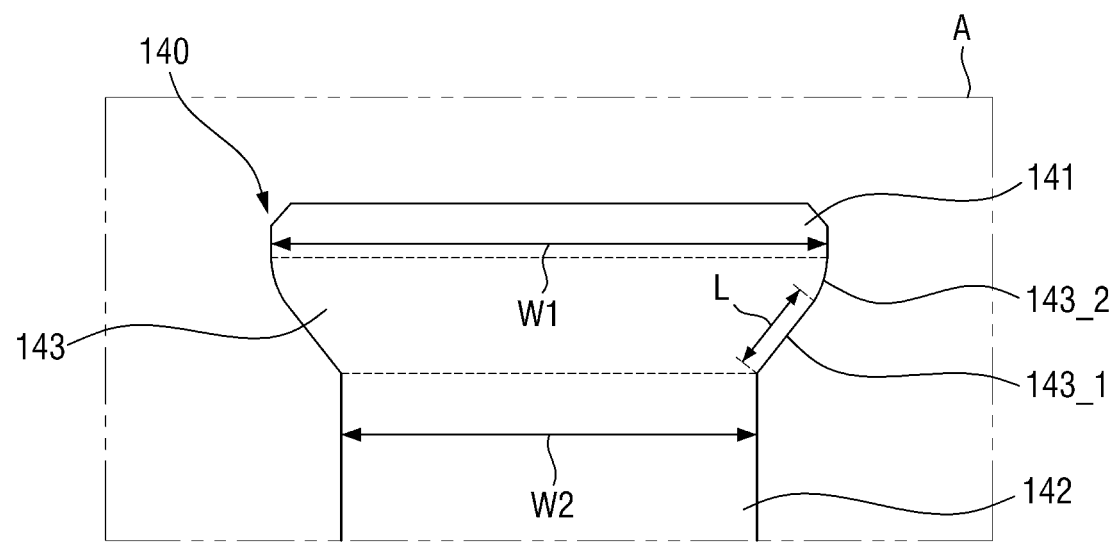
FIG. 6 is an enlarged view in which a region A of FIG. 4 is enlarged.
Figure 7:
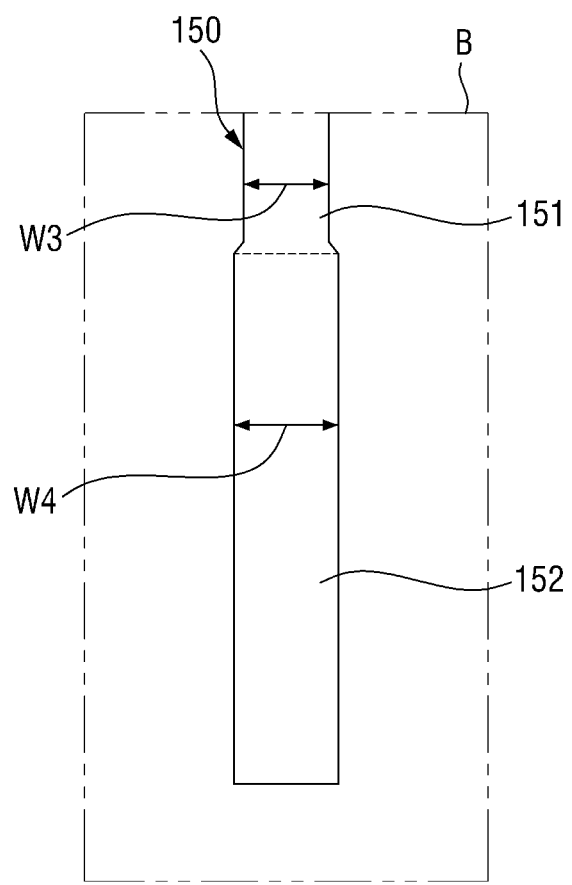
FIG. 7 is an enlarged view in which a region B of FIG. 4 is enlarged.
Figure 8:
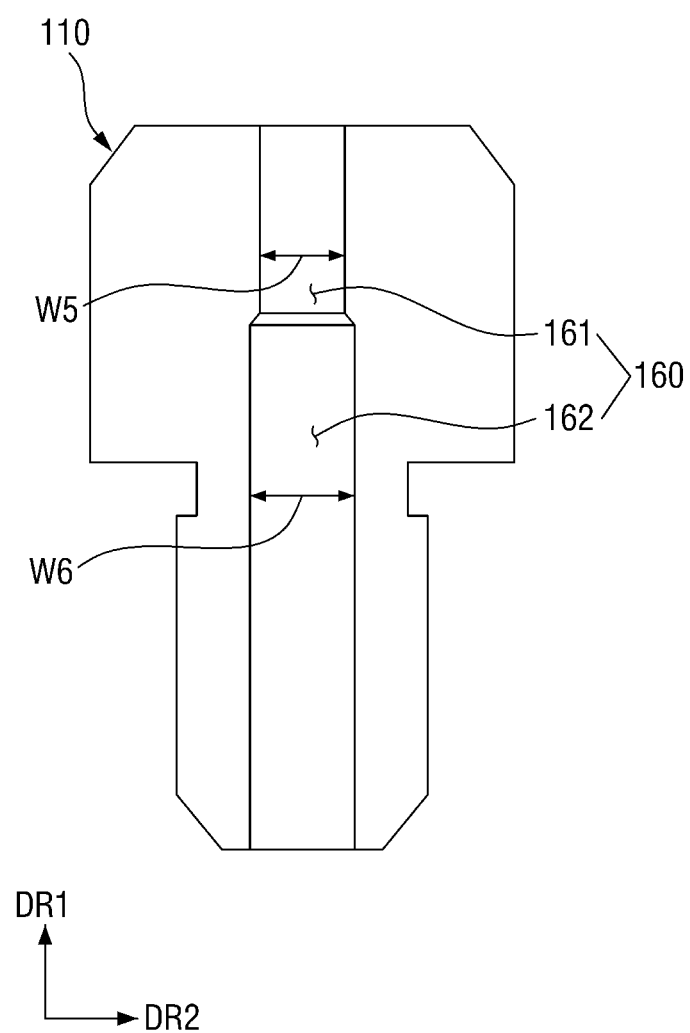
FIG. 8 is a cross-sectional view for illustrating an upper weight included in the lift pin module according to some embodiments of the present disclosure.
Figure 9:
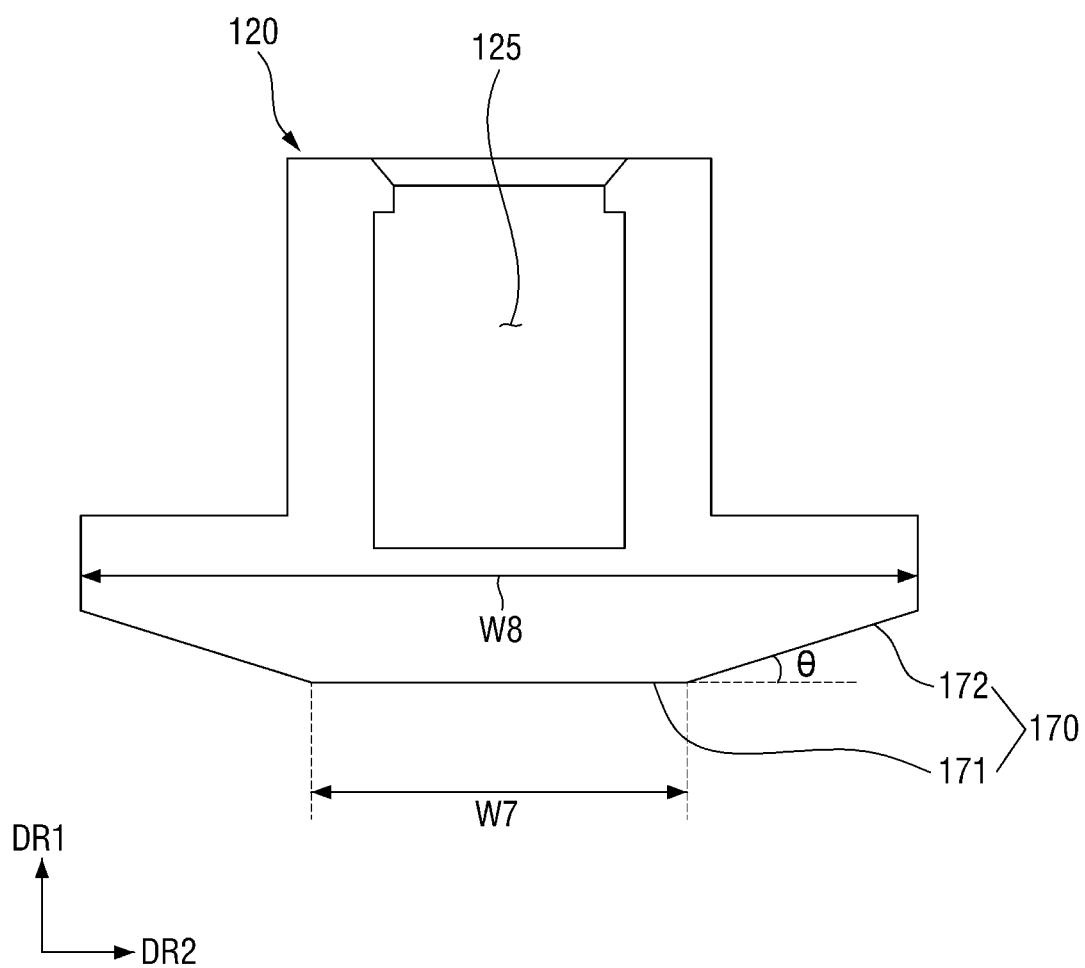
FIG. 9 is a cross-sectional view for illustrating a lower weight included in the lift pin module according to some embodiments of the present disclosure.

FIG. 1 is a diagram for schematically illustrating a semiconductor process chamber in which a lift pin module according to some embodiments of the present disclosure is installed. FIG. 2 is a diagram for illustrating an upper surface of a stage on which the lift pin module according to some embodiments of the present disclosure is installed. FIG. 3 is a perspective view for illustrating the lift pin module according to some embodiments of the present disclosure. FIG. 4 is an exploded perspective view for illustrating the lift pin module according to some embodiments of the present disclosure. FIG. 5 is a cross-sectional view for illustrating the lift pin module according to some embodiments of the present disclosure. FIG. 6 is an enlarged view in which a region A of FIG. 4 is enlarged. FIG. 7 is an enlarged view in which a region B of FIG. 4 is enlarged. FIG. 8 is a cross-sectional view for illustrating an upper weight included in the lift pin module according to some embodiments of the present disclosure. FIG. 9 is a cross-sectional view for illustrating a lower weight included in the lift pin module according to some embodiments of the present disclosure.

Referring to FIGS. 1 and 2, a lift pin module 10 according to some embodiments of the present disclosure may be installed on a stage 2 disposed inside a chamber 1 in which a semiconductor process is performed. Although FIG. 2 shows that three of the lift pin module 10 are installed on the stage 2, this is only for convenience of explanation, and embodiments of the present disclosure is not limited thereto.

The lift pin module 10 may be installed on the stage 2 by being inserted into a lift pin module insertion hole 4 formed on the stage 2 in a first direction DR1. A sidewall of the lift pin module insertion hole 4 may have an inclined profile. Specifically, a width of the lift pin module insertion hole 4 in a second direction DR2 perpendicular to the first direction DR1 may increase as it comes closer to the upper part of the chamber 1.

The stage 2 may move in the first direction DR1 by a stage support 3 connected to a lower part of the stage 2. The wafer 5 may be loaded into the chamber 1 through a wafer inlet 6 and positioned on the stage 2 on which the lift pin module 10 is installed.

The lift pin module 10 may be spaced apart from an inner wall 1a of the chamber 1. However, when the wafer 5 is loaded into the chamber 1 or unloaded from the chamber 1, the stage 2 is lowered and the lift pin module 10 may be brought into contact with the inner wall 1a of the chamber 1.

Referring to FIGS. 3 to 9, the lift pin module 10 includes a lift pin 100, an upper weight 110 and a lower weight 120.

The lift pin 100 may be connected to the stage 2 located inside the chamber 1.

The lift pin 100 may extend in the first direction DR1.

The lift pin 100 may include a head portion 140 and a connecting portion 150. The head portion 140 may be disposed at a first end of the lift pin 100. The connecting portion 150 may be disposed at a second end of the lift pin 100 that is opposite to the first end of the lift pin 100.

The head portion 140 of the lift pin 100 may be disposed in the lift pin module insertion hole 4 formed on the stage 2. The head portion 140 of the lift pin 100 may include first to third portions 141, 142 and 143.

Referring to FIG. 6, the first portion 141 of the head portion 140 of the lift pin 100 may be located at the top of the lift pin 100. The first portion 141 of the head portion 140 of the lift pin 100 may have a first width W1 in the second direction DR2.

The second portion 142 of the head portion 140 of the lift pin 100 may be located below the first portion 141 of the head portion 140 of the lift pin 100. That is, the second portion 142 of the head portion 140 of the lift pin 100 may be located between the first portion 141 of the head portion 140 of the lift pin 100 and the connecting portion 150 of the lift pin 100. The second portion 142 of the head portion 140 of the lift pin 100 may have a second width W2 in the second direction DR2 smaller than the first width W1. The second width W2 in the second direction DR2 of the second portion 142 of the head portion 140 of the lift pin 100 may be, for example, 2 mm to 4 mm. However, embodiments of the present disclosure are not limited thereto.

A third portion 143 of the head portion 140 of the lift pin 100 may be located between the first portion 141 of the head portion 140 of the lift pin 100 and the second portion 142 of the head portion 140 of the lift pin 100. The third portion 143 of the head portion 140 of the lift pin 100 may connect the first portion 141 of the head portion 140 of the lift pin 100 to the second portion 142 of the head portion 140 of the lift pin 100.

The sidewall of the third portion 143 of the head portion 140 of the lift pin 100 may have an inclined profile. Specifically, a width in the second direction DR2 of the sidewall of the third portion 143 of the head portion 140 of the lift pin 100 may increase as it comes closer to the first portion 141 of the head portion 140 of the lift pin 100.

The sidewall of the third portion 143 of the head portion 140 of the lift pin 100 may include a first sidewall 143_1 and a second sidewall 143_2.

The first sidewall 143_1 of the third portion 143 of the head portion 140 of the lift pin 100 may be connected to the second portion 142 of the head portion 140 of the lift pin 100. The first sidewall 143_1 of the third portion 143 of the head portion 140 of the lift pin 100 may extend in a third direction DR3 different from the first and second directions DR1 and DR2.

The first sidewall 143_1 of the third portion 143 of the head portion 140 of the lift pin 100 may have a length L in the third direction DR3. The length L in the third direction DR3 of the first sidewall 143_1 of the third portion 143 of the head portion 140 of the lift pin 100 may be, for example, 0.8 mm to 2.4 mm.

If the length L in the third direction DR3 of the first sidewall 143_1 of the third portion 143 of the head portion 140 of the lift pin 100 is smaller than 0.8 mm, the lift pin module 10 may be detached from the stage 2. If the length L in the third direction DR3 of the first sidewall 143_1 of the third portion 143 of the head portion 140 of the lift pin 100 is greater than 2.4 mm, the lift pin module 10 may protrude upward from the stage 2.

A ratio of the length L in the third direction DR3 of the first sidewall 143_1 of the third portion 143 of the head portion 140 of the lift pin 100 to the second width W2 in the second direction DR2 of the second portion 142 of the head portion 140 of the lift pin 100 may be 0.4 to 0.6.

For example, if the second width W2 in the second direction DR2 of the second portion 142 of the head portion 140 of the lift pin 100 is 2 mm, the length L in the third direction DR3 of the first sidewall 143_1 of the third portion 143 of the head portion 140 of the lift pin 100 may be 0.8 mm to 1.2 mm. Also, for example, if the second width W2 in the second direction DR2 of the second portion 142 of the head portion 140 of the lift pin 100 is 4 mm, the length L in the third direction DR3 of the first sidewall 143_1 of the third portion 143 of the head portion 140 the lift pin 100 may be 1.6 mm to 2.4 mm.

The second sidewall 143_2 of the third portion 143 of the head portion 140 of the lift pin 100 may be connected to the first portion 141 of the head portion 140 of the lift pin 100. The second sidewall 143_2 of the third portion 143 of the head portion 140 of the lift pin 100 may have a curved shape protruding in the second direction DR2.

Since the second sidewall 143_2 of the third portion 143 of the head portion 140 of the lift pin 100 has the curved shape, when the lift pin module 10 moves inside the lift pin module insertion hole 4 in the second direction DR2, the stress to be applied to the head portion 140 of the lift pin 100 can be alleviated.

Referring to FIG. 7, the connecting portion 150 of the lift pin 100 may be disposed inside the upper weight 110. The connecting portion 150 of the lift pin 100 may include a first portion 151 and a second portion 152.

The first portion 151 of the connecting portion 150 of the lift pin 100 may be disposed on the second portion 152 of the connecting portion 150 of the lift pin 100. That is, the first portion 151 of the connecting portion 150 of the lift pin 100 may be located between the head portion 140 of the lift pin 100 and the second portion 152 of the connecting portion 150 of the lift pin 100.

The first portion 151 of the connecting portion 150 of the lift pin 100 may have a third width W3 in the second direction DR2. The third width W3 in the second direction DR2 of the first portion 151 of the connecting portion 150 of the lift pin 100 may be the same as the second width W2 in the second direction DR2 of the second portion 142 of the head portion 140 of the lift pin 100. However, embodiments of the present disclosure are not limited thereto.

The second portion 152 of the connecting portion 150 of the lift pin 100 may be located at the bottom of the lift pin 100. The second portion 152 of the connecting portion 150 of the lift pin 100 may have a fourth width W4 in the second direction DR2 that is greater than the third width W3.

That is, the connecting portion 150 of the lift pin 100 may have a tapered shape in which the fourth width W4 of the second portion 152 is formed to be greater than the third width W3 of the first portion 151. Since the connecting portion 150 of the lift pin 100 has the tapered shape, the connecting portion 150 of the lift pin 100 may be effectively fixed inside the upper weight 110.

Referring to FIGS. 4, 5, and 8, the upper weight 110 may surround the connecting portion 150 of the lift pin 100.

The upper weight 110 may be formed such that the width of the upper part in the second direction DR2 is greater than the width of the lower part in the second direction DR2. A male screw-shaped thread may be formed on an outer peripheral surface of the lower part of the upper weight 110. The lower part of the upper weight 110 may be inserted into the lower weight 120. Thus, the upper weight 110 may be screwed to the lower weight 120.

Since the upper weight 110 is screwed to the lower weight 120, it is possible to prevent an occurrence of height difference between a plurality of the lift pin module 10 due to foreign matters that may exist between the upper weight 110 and the lower weight 120.

An opening 111 (see FIG. 4) may be formed on a side surface of the upper weight 110. The opening 111 may be formed to extend in the first direction DR1. The opening 111 may extend in the first direction DR1 as a whole over the upper part and the lower part of the upper weight 110. The lift pin 100 may be inserted into the upper weight 110 in the second direction DR2 through the opening 111.

Since the opening 111 is formed on the side surface of the upper weight 110, after the lift pin 100 is connected to the stage 2, the lift pin 100 may be positioned inside the upper weight 110.

The upper weight 110 may include a connecting hole 160 (see FIG. 8) in which the connecting portion 150 of the lift pin 100 is located. The connecting hole 160 of the upper weight 110 may have a shape corresponding to the connecting portion 150 of the lift pin 100.

Specifically, the connecting hole 160 of the upper weight 110 may include a first connecting hole 161 and a second connecting hole 162.

The first connecting hole 161 of the upper weight 110 may have a fifth width W5 in the second direction DR2. The first connecting hole 161 of the upper weight 110 may have a shape corresponding to the first portion 151 of the connecting portion 150 of the lift pin 100.

The second connecting hole 162 of the upper weight 110 may be disposed between the first connecting hole 161 of the upper weight 110 and the lower weight 120. The second connecting hole 162 of the upper weight 110 may have a sixth width W6 in the second direction DR2 greater than the fifth width W5. The second connecting hole 162 of the upper weight 110 may have a shape corresponding to the second portion 152 of the connecting portion 150 of the lift pin 100.

Although the upper weight 110 may include, for example, at least one of ceramics, metal, and plastic, embodiments of the present disclosure are not limited thereto.

Referring to FIGS. 4, 5, and 9, the lower weight 120 may be disposed below the upper weight 110. The lower weight 120 may be located at the bottom of the lift pin module 10.

The lower weight 120 may be formed such that a width of an upper part of the lower weight 120 in the second direction DR2 is smaller than a width of a lower part of the lower weight 120 in the second direction DR2. A screwing portion 125 into which a part of the upper weight 110 is inserted may be disposed in the upper part of the lower weight 120. A female screw-shaped thread may be formed on the sidewall of the screwing portion 125. The lower part of the lower weight 120 may be formed to protrude laterally further than the upper part of the lower weight 120.

Although FIG. 4 shows that a planar shape of the lower surface 170 of the lower weight 120 is circular, embodiments of the present disclosure are not limited thereto.

The lower surface 170 of the lower weight 120 may include a first surface 171, and a second surface 172 disposed to surround an edge of the first surface 171.

The first surface 171 of the lower weight 120 may overlaps the lift pin 100 in the first direction DR1. The first surface 171 of the lower weight 120 may have a seventh width W7 in the second direction DR2. The seventh width W7 in the second direction DR2 of the first surface 171 of the lower weight 120 may be, for example, 4 mm to 26 mm.

The second surface 172 of the lower weight 120 may be disposed to be inclined to the first surface 171 of the lower weight 120. An angle θ formed between the second surface 172 of the lower weight 120 and the first surface 171 of the lower weight 120 may be an acute angle, for example, 2 degrees to 20 degrees.

The lower surface 170 of the lower weight 120 may have an eighth width W8 in the second direction DR2. The eighth width W8 in the second direction DR2 of the lower surface 170 of the lower weight 120 may be, for example, 20 mm to 30 mm.

A ratio of the seventh width W7 in the second direction DR2 of the first surface 171 of the lower weight 120 to the eighth width W8 in the second direction DR2 of the lower surface 170 of the lower weight 120 may be 0.13 to 0.87.

For example, if the eighth width W8 in the second direction DR2 of the lower surface 170 of the lower weight 120 is 20 mm, the seventh width W7 in the second direction DR2 of the first surface 171 of the lower weight 120 may be 4 mm to 16 mm. In this case, the ratio of the seventh width W7 in the second direction DR2 of the first surface 171 of the lower weight 120 to the eighth width W8 in the second direction DR2 of the lower surface 170 of the lower weight 120 may be 0.2 to 0.8.

Also, for example, if the eighth width W8 in the second direction DR2 of the lower surface 170 of the lower weight 120 is 30 mm, the seventh width W7 in the second direction DR2 of the first surface 171 of the lower weight 120 may be 4 mm to 26 mm. In this case, the ratio of the seventh width W7 in the second direction DR2 of the first surface 171 of the lower weight 120 to the eighth width W8 in the second direction DR2 of the lower surface 170 of the lower weight 120 may be 0.13 to 0.87.

Although the lower weight 120 may include, for example, at least one of ceramics, metal, and plastic, embodiments of the present disclosure are not limited thereto.

Since the lower surface 170 of the lower weight 120 includes the second surface 172 that is inclined, even in the case in which the lower surface 170 of the lower weight 120 is inclined in the state of being in contact with the inner wall 1*a* of the chamber 1, structural stability can be achieved.

Hereinafter, a method for fastening the lift pin module according to some embodiments of the present disclosure will be described with reference to FIGS. 5 and 10-13.

FIGS. 10 to 13 are diagrams for illustrating the method for fastening the lift pin module according to some embodiments of the present disclosure.

Figure 10:
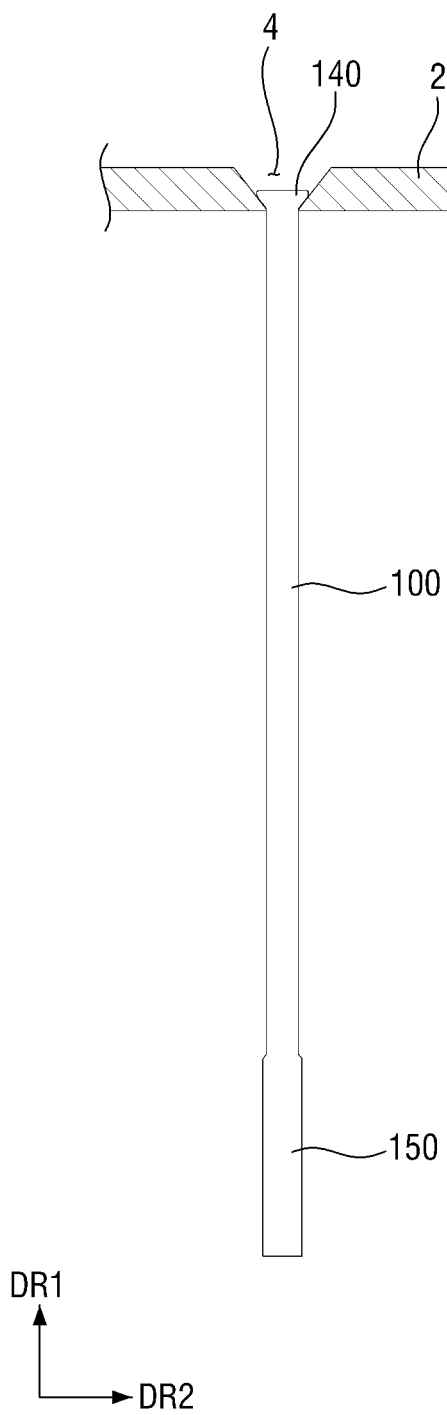
FIG. 10 is a first diagram for illustrating a method for fastening the lift pin module according to some embodiments of the present disclosure.

Referring to FIG. 10, the lift pin 100 may be inserted into the lift pin module insertion hole 4 formed on the stage 2. In this case, since the head portion 140 of the lift pin 100 is placed on the lift pin module insertion hole 4, the lift pin 100 may be installed on the stage 2.

Figure 11:
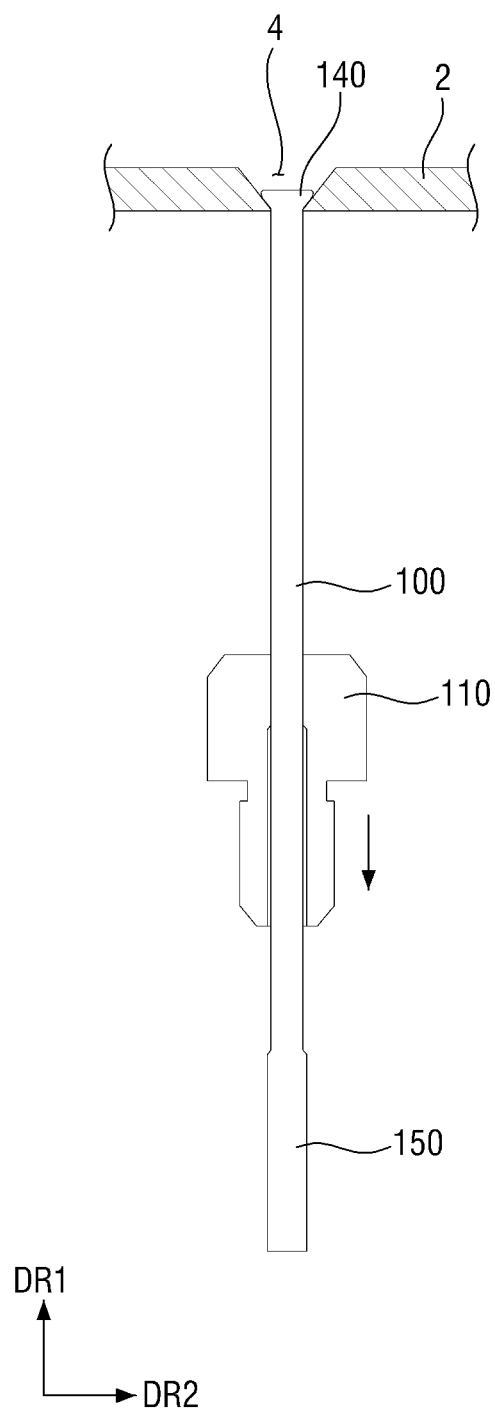
FIG. 11 is a second diagram for illustrating the method for fastening the lift pin module according to some embodiments of the present disclosure.

Referring to FIG. 11, the upper weight 110 may be coupled to a side surface of the lift pin 100. Specifically, the lift pin 100 may be laterally coupled to the upper weight 110 via the opening 111 (see FIG. 4) formed on the side surface of the upper weight 110.

Figure 12:
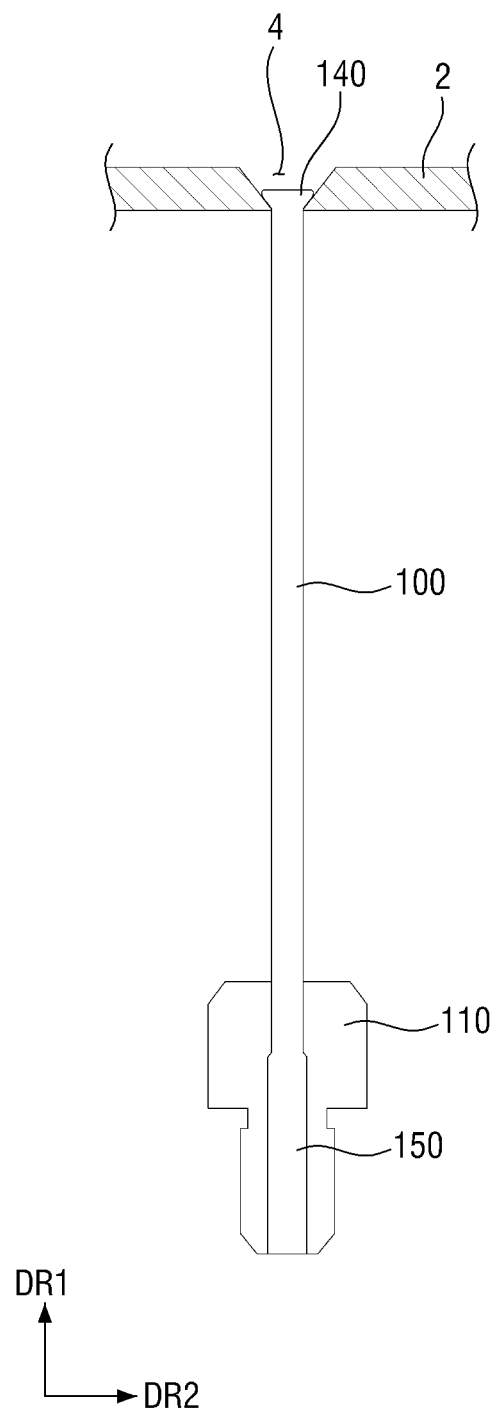
FIG. 12 is a third diagram for illustrating the method for fastening the lift pin module according to some embodiments of the present disclosure.

Referring to FIG. 12, the upper weight 110 may be lowered along the lift pin 100. The lowered upper weight 110 may be positioned to surround the connecting portion 150 of the lift pin 100. In this case, the upper weight 110 may be positioned to surround the connecting portion 150 of the lift pin 100, using the connecting hole 160 (see FIG. 8) formed in the upper weight 110 and a tapered shape formed in the connecting portion 150 of the lift pin 100.

Figure 13:
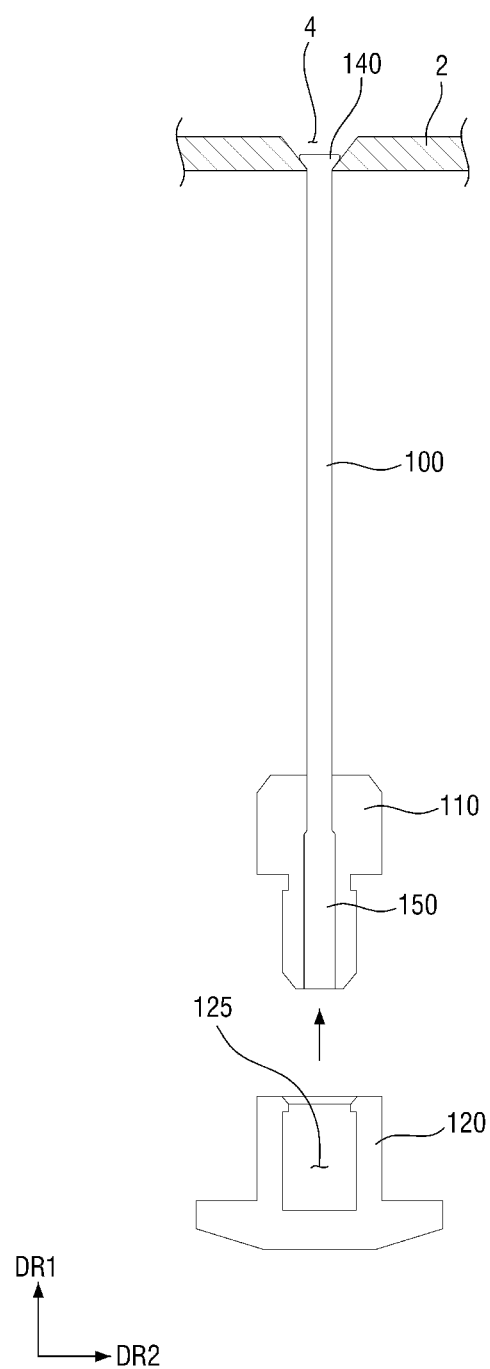
FIG. 13 is a fourth diagram for illustrating the method for fastening the lift pin module according to some embodiments of the present disclosure.

Referring to FIG. 13, the lower weight 120 may be screwed to the upper weight 110. Specifically, a part of the upper weight 110 may be inserted and screwed into the screwing portion 125 formed on the lower weight 120.

The lift pin module 10 may be fastened to the stage 2 as shown in FIG. 5, through the method for fastening the lift pin module 10 described above.

Hereinafter, a lift pin module according to some other embodiments of the present disclosure will be described with reference to FIG. 14. The description will focus on differences from the lift pin module shown in FIG. 5.

Figure 14:
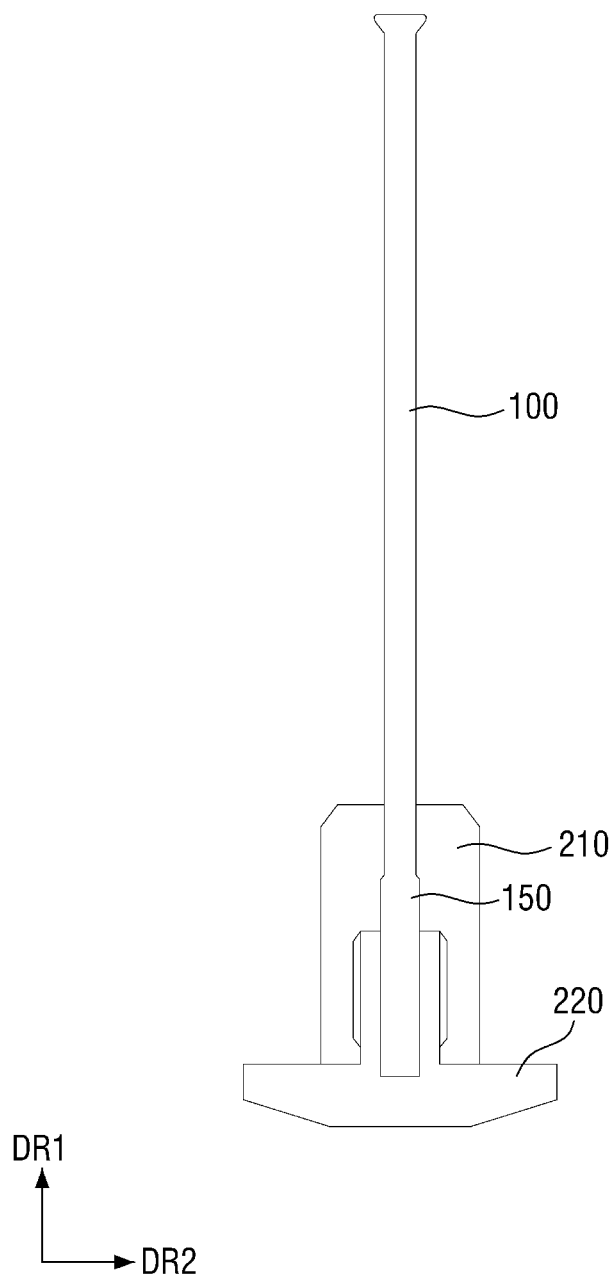
FIG. 14 is a diagram for illustrating the lift pin module according to some other embodiments of the present disclosure.

FIG. 14 is a diagram for illustrating the lift pin module according to some other embodiments of the present disclosure.

Referring to FIG. 14, in the lift pin module according to some other embodiments of the present disclosure, a part of the lower weight 220 may be inserted and screwed into the upper weight 210.

A male screw-shaped thread may be formed on the outer peripheral surface of the upper part of the lower weight 220 to be inserted into the upper weight 210. A screwing portion into which a part of the lower weight 220 is inserted may be formed inside the upper weight 210. A female screw-shaped thread may be formed on the sidewall of the screwing portion of the upper weight 210.

Hereinafter, the lift pin module according to some other embodiments of the present disclosure will be described with reference to FIGS. 15 and 16. The description will focus on the differences from the lift pin module shown in FIGS. 1 and 2.

Figure 15:
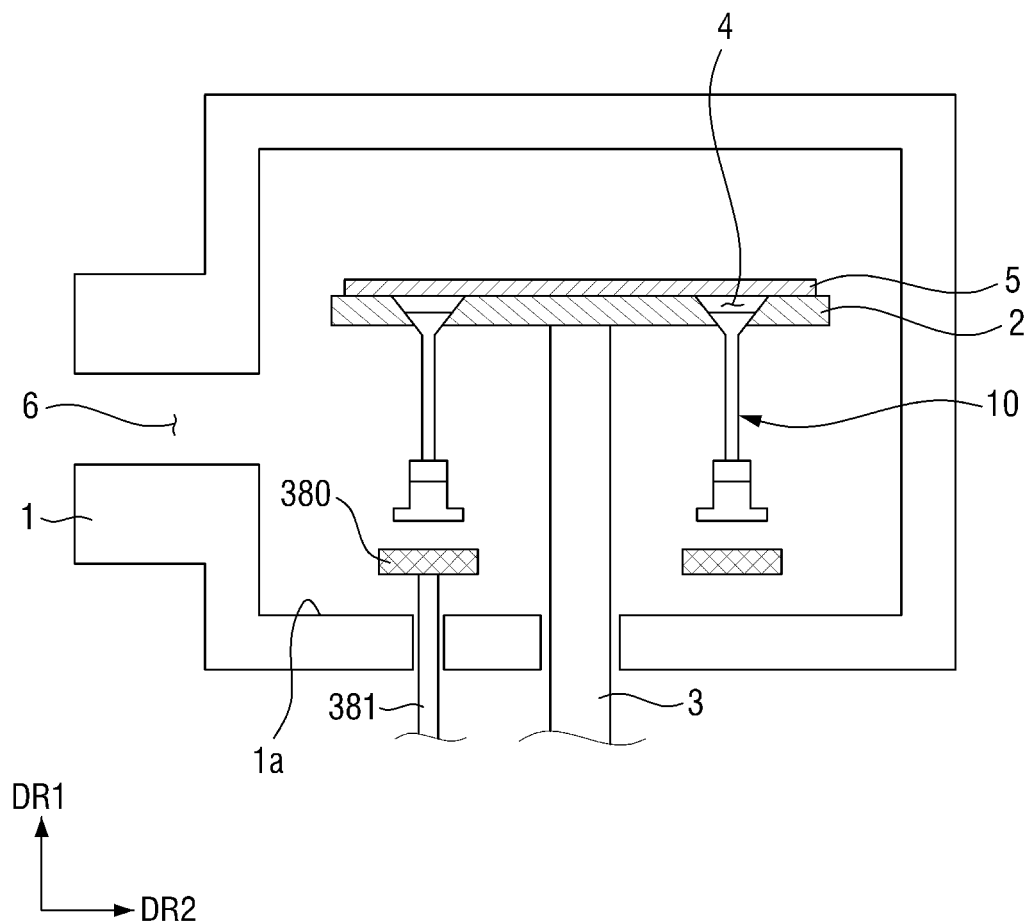
FIG. 15 is a diagram for illustrating the lift pin module according to some other embodiments of the present disclosure.

FIG. 15 is a diagram for illustrating a lift pin module according to some other embodiments of the present disclosure. FIG. 16 is a diagram for illustrating an upper surface of a stage on which the lift pin module shown in FIG. 15 is installed.

Figure 16:
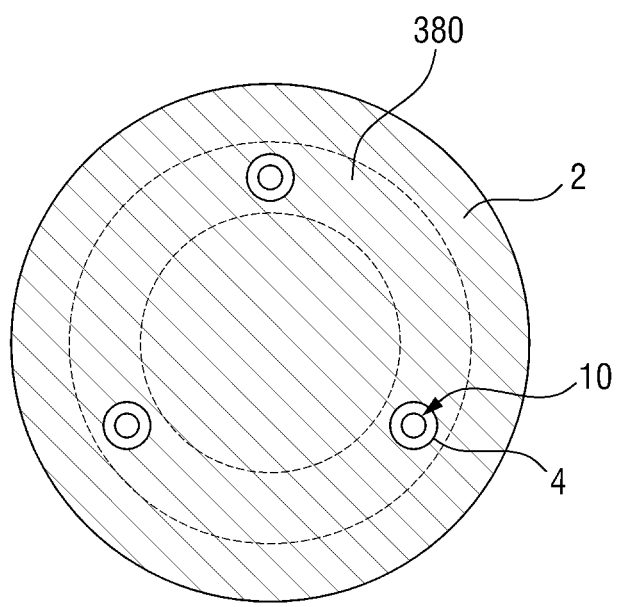
FIG. 16 is a diagram for illustrating an upper surface of a stage on which the lift pin module shown in FIG. 15 is installed.

Referring to FIGS. 15 and 16, a lift pin module according to some other embodiments of the present disclosure may include a lift plate 380 disposed between the lower weight 120 (see FIG. 5) and the inner wall 1a of the chamber 1. The lift plate 380 may have a ring shape, as shown in FIG. 16. However, embodiments of the present disclosure is not limited thereto.

The lift plate 380 may move in the first direction DR1 by a lift plate support 381 connected to a lower part of the lift plate 380. The lift plate 380 may rise to come into contact with the lower weight 120 (see FIG. 5). Also, when the stage 2 is lowered, the lower weight 120 (see FIG. 5) may come into contact with the lift plate 380.

Hereinafter, a lift pin module according to some other embodiments of the present disclosure will be described with reference to FIGS. 17 and 18. The description will focus on the differences from the lift pin module shown in FIG. 3.

Figure 17:
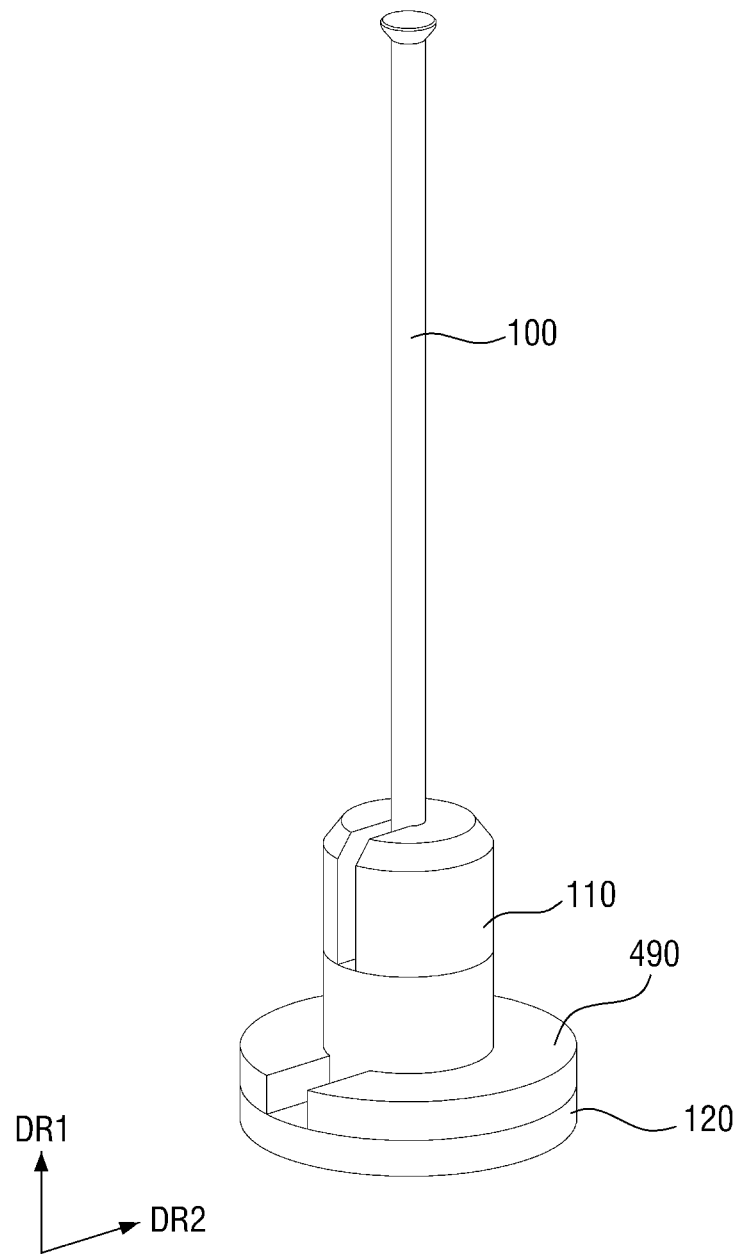
FIG. 17 is a diagram for illustrating a lift pin module according to some other embodiments of the present disclosure.

FIG. 17 is a diagram for illustrating a lift pin module according to some other embodiments of the present disclosure. FIG. 18 is a diagram for illustrating an additional weight installed on the lift pin module shown in FIG. 17.

Figure 18:
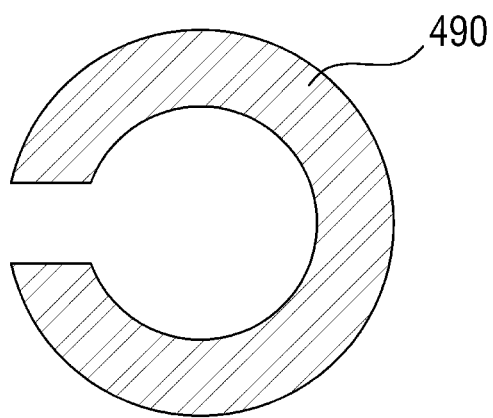
FIG. 18 is a diagram for illustrating an additional weight installed on the lift pin module shown in FIG. 17.

Referring to FIGS. 17 and 18, the lift pin module according to some other embodiments of the present disclosure may include an additional weight 490 disposed on the lower weight 120.

The additional weight 490 may be disposed on the upper surface of the lower part of the lower weight 120 protruding laterally. The additional weight 490 may be disposed to surround the upper side surface of the lower weight 120 on which the screwing portion 125 (see FIG. 9) is formed. The additional weight 490 may have a ring shape with a part of the side surface opened.

Although the additional weight 490 may include, for example, at least one of ceramics, metal, and plastic, embodiments of the present disclosure are not limited thereto.

Hereinafter, the lift pin module according to some other embodiments of the present disclosure will be described with reference to FIGS. 17 and 19. The description will focus on the differences from the lift pin module shown in FIG. 3.

Figure 19:
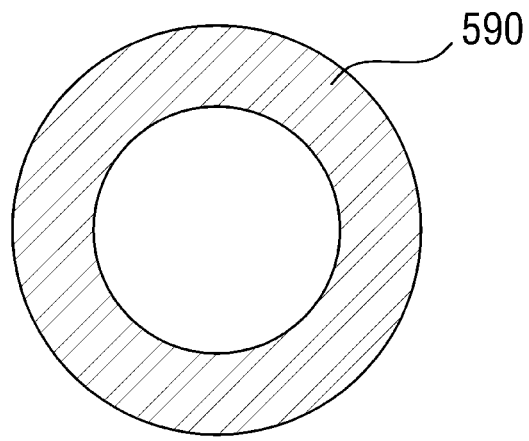
FIG. 19 is a diagram for illustrating an additional weight installed on the lift pin module shown in FIG. 17.

FIG. 19 is a diagram for illustrating an additional weight that may be installed in the lift pin module shown in FIG. 17, as an alternative to the additional weight 490.

Referring to FIGS. 17 and 19, the lift pin module according to some other embodiments of the present disclosure may include an additional weight 590 which is disposed on the lower weight 120.

The additional weight 590 may be disposed on the upper surface of the lower part of the lower weight 120 protruding laterally. The additional weight 590 may be disposed to surround the upper side surface of the lower weight 120 on which the screwing portion 125 (see FIG. 9) is formed. The additional weight 590 may have a ring shape with closed side surfaces.

Although the additional weight 590 may include, for example, at least one of ceramics, metal, and plastic, embodiments of the present disclosure are not limited thereto.

Hereinafter, a lift pin module according to some other embodiments of the present disclosure will be described with reference to FIG. 20. The description will focus on the differences from the lift pin module shown in FIG. 9.

Figure 20:
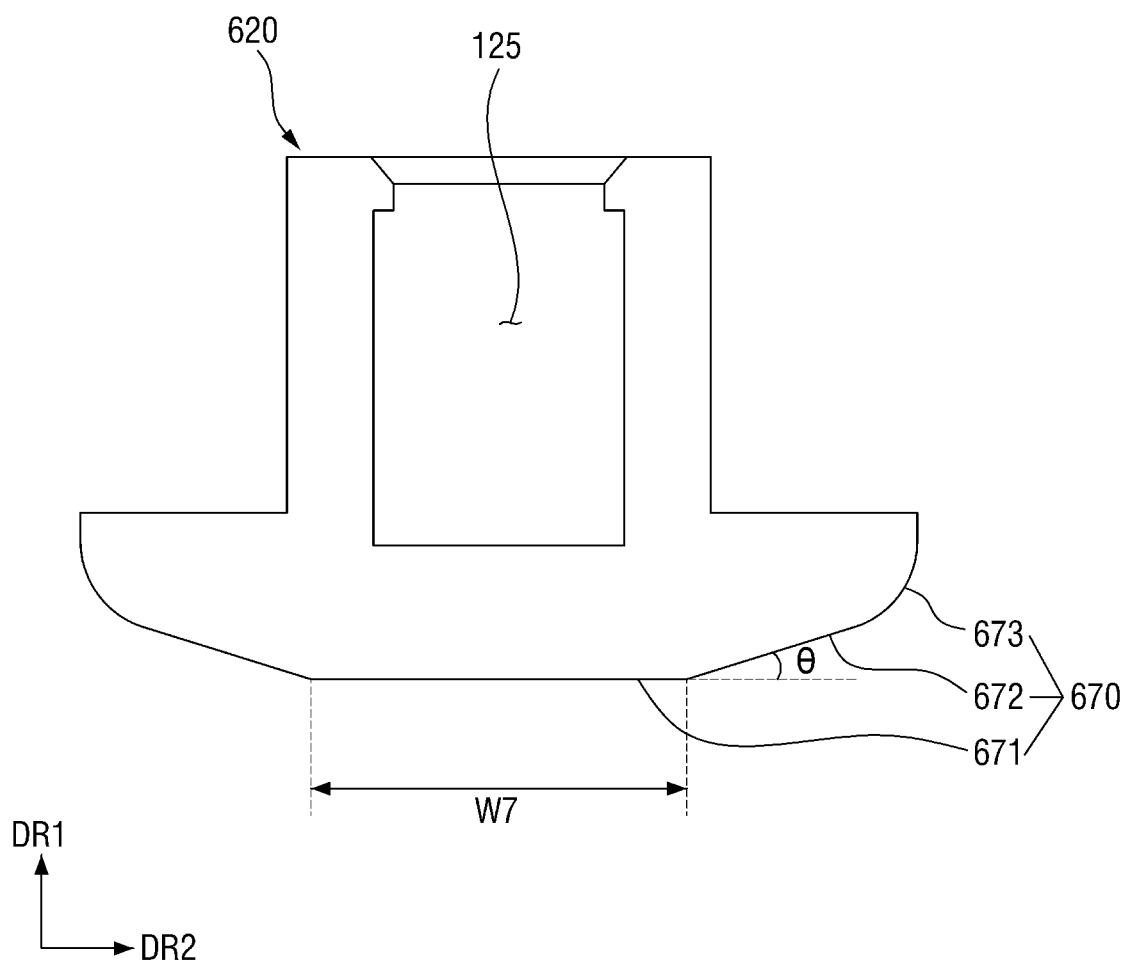
FIG. 20 is a diagram for illustrating the lift pin module according to some other embodiments of the present disclosure.

FIG. 20 is a diagram for illustrating a lift pin module according to some other embodiments of the present disclosure.

Referring to FIG. 20, in the lift pin module according to some other embodiments of the present disclosure, a lower weight 620 may be provided instead of the lower weight 120. A curved surface may be formed on a lower surface 670 of the lower weight 620.

The lower surface 670 of the lower weight 620 may include a first surface 671, a second surface 672 disposed to surround an edge of the first surface 671, and a third surface 673 disposed to surround an edge of the second surface 672. The third surface 673 may be located on the outermost side of the lower surface 670 of the lower weight 620.

The first surface 671 of the lower weight 620 may have a planar shape. The second surface 672 of the lower weight 620 may be disposed to be inclined to the first surface 671 of the lower weight 620. The third surface 673 of the lower weight 620 may have a curved shape in the second direction DR2.

Hereinafter, a lift pin module according to some other embodiments of the present disclosure will be described with reference to FIG. 21. The description will focus on the differences from the lift pin module shown in FIG. 6.

Figure 21:
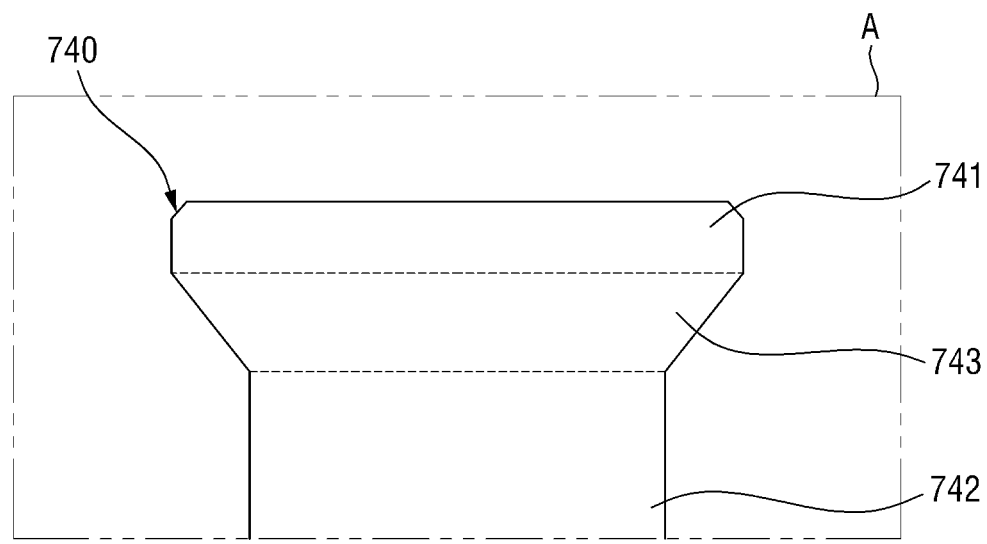
FIG. 21 is a diagram for illustrating the lift pin module according to some other embodiments of the present disclosure.
Figure 21:
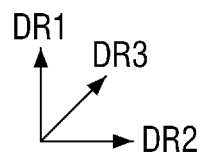

FIG. 21 is a diagram for illustrating a lift pin module according to some other embodiments of the present disclosure.

Referring to FIG. 21, in the lift pin module according to some other embodiments of the present disclosure, the lift pin 100 may include a head portion 740 instead of a head portion 140 in the area A of the lift pin 100. The head portion 740 of the lift pin may include first to third portions 741, 742 and 743.

The first portion 741 of the head portion 740 of the lift pin may be located at the top of the lift pin. The second portion 742 of the head portion 740 of the lift pin may be located below the first portion 741 of the head portion 740 of the lift pin.

The third portion 743 of the head portion 740 of the lift pin may be disposed between the first portion 741 of the head portion 740 of the lift pin and the second portion 742 of the head portion 740 of the lift pin. The third portion 743 of the head portion 740 of the lift pin may connect the first portion 741 of the head portion 740 of the lift pin to the second portion 742 of the head portion 740 of the lift pin.

An inclined profile of the sidewall of the first portion 741 of the head portion 740 of the lift pin may be different from an inclined profile of the sidewall of the third portion 743 of the head portion 740 of the lift pin. That is, in the cross-sectional view of FIG. 21, an inflection point may be formed at a portion on which the sidewall of the first portion 741 of the head portion 740 of the lift pin comes into contact with the sidewall of the third portion 743 of the head portion 740 of the lift pin.

Hereinafter, a lift pin module according to some other embodiments of the present disclosure will be described with reference to FIG. 22. The description will focus on the differences from the lift pin module shown in FIG. 3.

Figure 22:
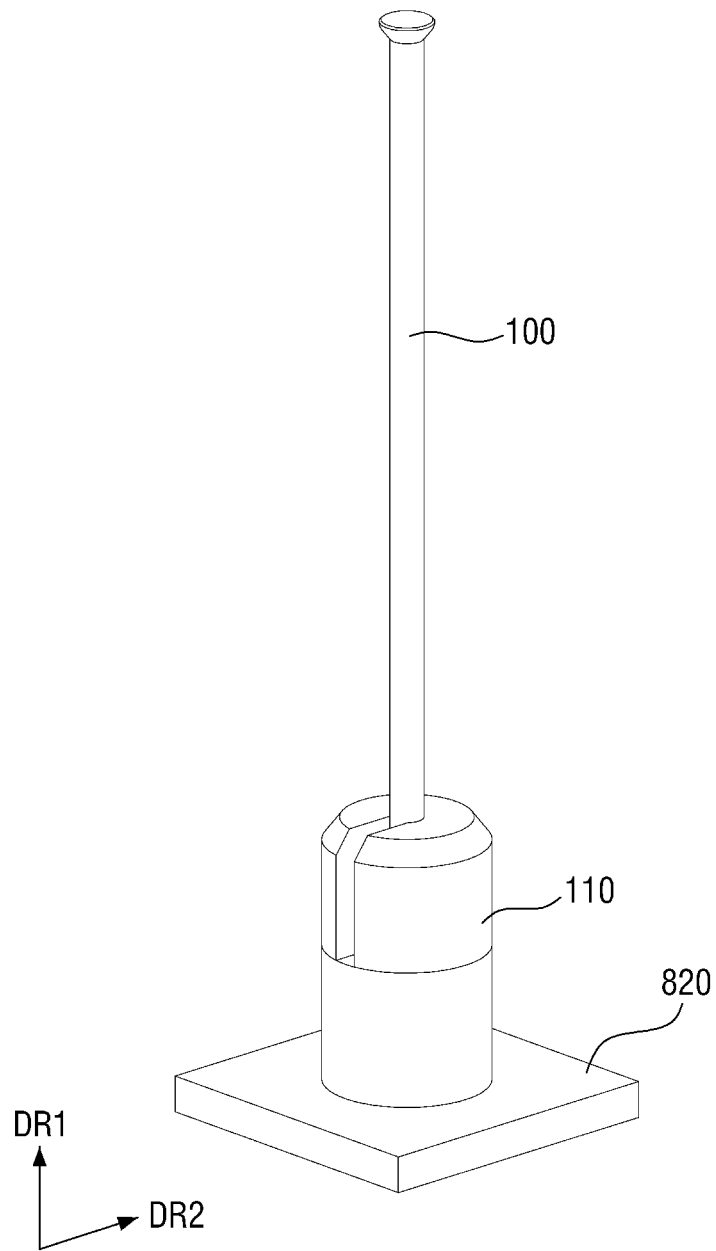
FIG. 22 is a diagram for illustrating the lift pin module according to some other embodiments of the present disclosure.

FIG. 22 is a diagram for illustrating a lift pin module according to some other embodiments of the present disclosure.

Referring to FIG. 22, in the lift pin module according to some other embodiments of the present disclosure, a lower weight 820 may be provided instead of the lower weight 120. A lower surface of the lower weight 820 may have a square shape. However, embodiments of the present disclosure are not limited thereto. That is, in some other embodiments, the shape of the lower surface of the lower weight 820 may have other shapes than a circular shape and a rectangular shape.

Hereinafter, a lift pin module according to some other embodiments of the present disclosure will be described with reference to FIG. 23. The description will focus on the differences from the lift pin module shown in FIG. 9.

Figure 23:
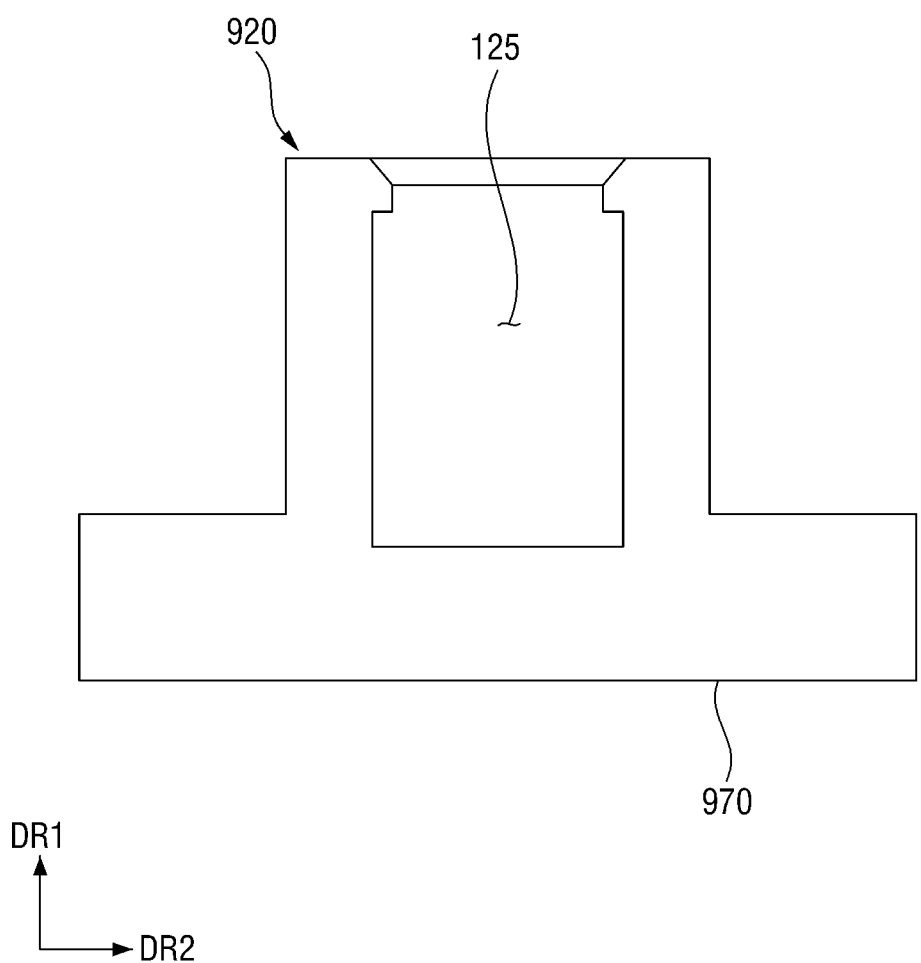
FIG. 23 is a diagram for illustrating the lift pin module according to some other embodiments of the present disclosure.

FIG. 23 is a diagram for illustrating the lift pin module according to some other embodiments of the present disclosure.

Referring to FIG. 23, in the lift pin module according to some other embodiments of the present disclosure, a lower weight 920 may be provided instead of the lower weight 120. A lower surface 970 of the lower weight 920 may have a planar shape.

While non-limiting example embodiments of the present disclosure have been described above with reference to the accompanying drawings, embodiments of the present disclosure are not limited to the aforementioned embodiments, and may be manufactured in various different forms, and those having ordinary knowledge in the technical field to which the present disclosure pertains may understand that embodiments of the present disclosure may be provided in other specific forms without departing from the scope of the present disclosure. Therefore, it should be understood that the embodiments described above are illustrative in all aspects and not restrictive.

What is claimed is:

1. A lift pin module comprising: a lift pin which comprises a head portion disposed at a first end of the lift pin in a first direction, and a connecting portion disposed at a second end of the lift pin opposite to the first end, the head portion connected to a stage disposed inside a semiconductor process chamber; an upper weight which comprises a side surface with an opening extending in the first direction, the opening configured to receive the lift pin therein, and the upper weight surrounding the connecting portion of the lift pin; and a lower weight screwed to the upper weight, the lower weight disposed below the upper weight.

2. The lift pin module of claim 1, wherein a part of the upper weight is inserted and screwed into the lower weight.

3. The lift pin module of claim 1, wherein a part of the lower weight is inserted and screwed into the upper weight.

4. The lift pin module of claim 1, wherein the connecting portion of the lift pin comprises:
   a first portion having a first width in a second direction perpendicular to the first direction, and
   a second portion disposed between the first portion and the lower weight in the first direction and having a second width in the second direction greater than the first width.

5. The lift pin module of claim 4, wherein the first portion of the connecting portion of the lift pin and the second portion of the connecting portion of the lift pin are disposed inside the upper weight.

6. The lift pin module of claim 1, wherein a lower surface of the lower weight comprises:
   a first surface which overlaps the lift pin in the first direction, and
   a second surface which surrounds an edge of the first surface and is inclined with respect to the first surface.

7. The lift pin module of claim 6, wherein an angle formed between the first surface of the lower weight and the second surface of the lower weight is 2 degrees to 20 degrees.

8. The lift pin module of claim 6, wherein
   the first surface of the lower weight has a third width in a second direction perpendicular to the first direction,
   the lower surface of the lower weight has a fourth width in the second direction, and
   a ratio of the third width to the fourth width is 0.13 to 0.87.

9. The lift pin module of claim 6, wherein a third width of the first surface of the lower weight in a second direction perpendicular to the first direction is 4 mm to 26 mm.

10. The lift pin module of claim 1, further comprising:
    a lift plate which is disposed between the lower weight and an inner wall of the semiconductor process chamber in the first direction, and is configured to move the lift pin in the first direction.

11. The lift pin module of claim 1, further comprising:
    an additional weight that surrounds at least a part of the lower weight.

12. The lift pin module of claim 1, wherein an edge of a lower surface of the lower weight has a curved surface shape in a second direction perpendicular to the first direction.

13. The lift pin module of claim 1, wherein a lower surface of the lower weight has a planar shape.

14. A lift pin module comprising: a lift pin comprising a head portion disposed at a first end of the lift pin in a first direction, and a connecting portion disposed at a second end of the lift pin opposite to the first end, the head portion connected to a stage disposed inside a semiconductor process chamber; an upper weight into which the lift pin is inserted and which surrounds the connecting portion of the lift pin; and a lower weight into which a part of the upper weight is inserted and which is screwed to the upper weight, the lower weight disposed below the upper weight, wherein a lower surface of the lower weight comprises: a first surface which overlaps the lift pin in the first direction, and a second surface which surrounds an edge of the first surface and is inclined with respect to the first surface.

15. The lift pin module of claim 14, wherein the head portion of the lift pin comprises:
    a first portion having a first width in a second direction perpendicular to the first direction,
    a second portion which is disposed between the first portion and the connecting portion of the lift pin in the first direction, and has a second width in the second direction smaller than the first width, and
    a third portion which is between the first portion and the second portion in the first direction, and has a third width in the second direction that increases towards the first portion.

16. The lift pin module of claim 15, wherein at least a part of a sidewall of the third portion connected to the first portion has a curved surface shape in the second direction perpendicular to the first direction.

17. The lift pin module of claim 15, wherein the third portion comprises a sidewall that extends in a third direction different from the first direction and the second direction, the sidewall connects the first portion and the second portion, and a length of the sidewall, of the third portion, in the third direction is 0.8 mm to 2.4 mm.

18. The lift pin module of claim 15, wherein
the third portion comprises a sidewall that extends in a third direction different from the first direction and the second direction, the sidewall connects the first portion and the second portion, and
a ratio of a length of the sidewall, of the third portion, in the third direction to the second width in the second direction is 0.4 to 0.6.

19. The lift pin module of claim 14, wherein
the upper weight includes a connecting hole formed therein in which the connecting portion of the lift pin is disposed, and
the connecting hole includes:
  a first connecting hole having a third width in a second direction perpendicular to the first direction, and
  a second connecting hole which is disposed between the first connecting hole and the lower weight in the first direction, and has a fourth width in the second direction greater than the third width.

20. A lift pin module comprising: a lift pin which comprises a head portion disposed at a first end of the lift pin in a first direction, and a connecting portion disposed at a second end of the lift pin opposite to the first end, the head portion connected to a stage disposed inside a semiconductor process chamber; an upper weight which includes a side surface with an opening extending in the first direction, the opening configured to receive the lift pin therein, and the upper weight surrounding the connecting portion of the lift pin; and a lower weight into which a part of the upper weight is inserted, the lower weight screwed to the upper weight and disposed below the upper weight, wherein the connecting portion of the lift pin comprises: a first portion having a first width in a second direction perpendicular to the first direction, and a second portion disposed between the first portion and the lower weight in the first direction and having a second width in the second direction greater than the first width, and a lower surface of the lower weight comprises: a first surface which overlaps the lift pin in the first direction, and a second surface which surrounds an edge of the first surface and is inclined with respect to the first surface.

* * * * *